United States Patent [19]

Pritchett

[11] Patent Number: 4,870,373
[45] Date of Patent: Sep. 26, 1989

[54] CONSTANT PHASE GAIN CONTROL CIRCUIT

[75] Inventor: Samuel D. Pritchett, Flower Mound, Tex.

[73] Assignee: Texas Instruments Incorporated, Dallas, Tex.

[21] Appl. No.: 943,272

[22] Filed: Dec. 17, 1986

[51] Int. Cl.$^4$ ............................ H03G 3/10; H03F 3/16
[52] U.S. Cl. ....................................... 330/279; 330/277
[58] Field of Search ............... 330/277, 278, 279, 285, 330/300, 307, 129, 130, 131

[56] References Cited

U.S. PATENT DOCUMENTS

| 4,275,361 | 6/1981 | Schürmann | 330/277 |
| 4,338,572 | 7/1982 | Schürmann | 330/285 X |
| 4,468,631 | 8/1984 | Goldberg | 330/278 X |
| 4,511,854 | 4/1985 | Kishida | 330/279 |
| 4,578,603 | 3/1986 | McPherson | 330/277 X |

Primary Examiner—Steven Mottola
Attorney, Agent, or Firm—René E. Grossman; James T. Comfort; Melvin Sharp

[57] ABSTRACT

The disclosure relates to a dual gate FET used in variable power amplifiers wherein a gain control circuit is provided across the dual gate electrodes whereby the voltage on one of the gate electrodes is a function of the voltage on the other gate electrode.

4 Claims, 3 Drawing Sheets

NEW BIAS CONFIGURATION EXPERIMENT

UNIT #1
CIRCUIT UA-02

Phase Bridge Measurements          DATE

Freq = 9.7GHz    VD = 8.00 Volts    Pin = 23dBm

| G2 Volts | Vg1 = -1.6V VG2(max) = +0.75 | | | Vg1 = -1.8V VG2(max) = +0.75 | | | Vg1 = -2.0V VG2(max) = +0.70 | | | Vg1 = -2.2V VG2(max) = +0.50 | | | Vg1 = -2.4V VG2(max) = +0.50 | | |
|---|---|---|---|---|---|---|---|---|---|---|---|---|---|---|---|
| | Id | Pout | Phase | Id | Pout | Phase | Id | Pout | Phase | Id | Pout | Phase | Id | Pout | Phase |
| MAX | 367 | 29.7 | 344.6 | 329 | 29.5 | 351.6 | 285 | 29.0 | 0.0 | 242 | 28.4 | 8.0 | 209 | 27.6 | 13.0 |
| Pulsed | 400 | 29.9 | 346.5 | 374 | 29.8 | 354.6 | 337 | 29.5 | 1.4 | 295 | 28.9 | 7.9 | 253 | 28.0 | 14.0 |
| +1.00 | | | | | | | | | | | | | | | |
| +0.75 | 367 | 29.7 | 344.6 | 329 | 29.5 | 351.6 | | | | | | | | | |
| +0.50 | 358 | 29.6 | 345.4 | 321 | 29.4 | 352.6 | 281 | 29.0 | 0.8 | 242 | 28.4 | 8.0 | 209 | 27.6 | 13.0 |
| +0.25 | 348 | 29.5 | 345.7 | 314 | 29.3 | 353.4 | 275 | 28.9 | 1.0 | 237 | 28.3 | 8.2 | 205 | 27.5 | 13.0 |
| 0.00 | 342 | 29.4 | 346.6 | 305 | 29.0 | 353.5 | 268 | 28.6 | 0.8 | 232 | 28.0 | 8.0 | 201 | 27.4 | 12.6 |
| -0.25 | 327 | 28.9 | 345.0 | 297 | 28.7 | 353.2 | 261 | 28.4 | 0.0 | 226 | 27.8 | 7.0 | 196 | 27.0 | 11.6 |
| -0.50 | 315 | 28.5 | 344.2 | 286 | 28.3 | 352.1 | 252 | 28.0 | 359.0 | 220 | 27.5 | 6.0 | 190 | 26.7 | 10.0 |
| -0.75 | 302 | 27.8 | 342.6 | 275 | 27.6 | 351.0 | 243 | 27.4 | 357.2 | 212 | 26.8 | 4.0 | 184 | 26.2 | 8.5 |
| -1.00 | 287 | 26.9 | 340.6 | 263 | 26.9 | 349.1 | 233 | 26.5 | 355.0 | 204 | 26.2 | 2.0 | 177 | 25.6 | 6.6 |
| -1.25 | 270 | 26.0 | 338.7 | 249 | 26.0 | 347.3 | 222 | 25.8 | 353.5 | 194 | 25.4 | 0.0 | 170 | 24.9 | 4.6 |
| -1.50 | 250 | 24.8 | 336.5 | 233 | 25.0 | 345.5 | 209 | 24.8 | 351.0 | 185 | 24.5 | 357.8 | 162 | 24.0 | 2.5 |
| -1.75 | 230 | 23.8 | 335.0 | 217 | 23.9 | 344.0 | 196 | 23.6 | 349.4 | 174 | 23.5 | 356.1 | 153 | 23.1 | 0.5 |
| -2.00 | 208 | 22.5 | 333.1 | 199 | 22.6 | 342.4 | 180 | 22.4 | 347.1 | 162 | 22.4 | 353.7 | 143 | 22.0 | 358.2 |
| -2.25 | 188 | 21.1 | 331.7 | 180 | 21.4 | 340.5 | 165 | 21.0 | 345.2 | 149 | 21.0 | 351.5 | 133 | 20.9 | 355.8 |
| -2.50 | 166 | 19.6 | 330.0 | 160 | 19.8 | 339.0 | 148 | 19.7 | 343.4 | 136 | 19.7 | 349.5 | 122 | 19.5 | 353.4 |
| -2.75 | 144 | 17.9 | 327.4 | 140 | 18.2 | 336.3 | 131 | 18.1 | 341.2 | 122 | 18.2 | 347.0 | 110 | 18.0 | 350.5 |
| -3.00 | 123 | 16.2 | 324.7 | 121 | 16.5 | 333.6 | 113 | 16.3 | 338.4 | 107 | 16.6 | 344.1 | 97 | 16.4 | 347.0 |
| -3.25 | 102 | 14.3 | 321.1 | 102 | 14.6 | 331.0 | 96 | 14.5 | 335.4 | 91 | 14.7 | 340.8 | 84 | 14.6 | 343.6 |
| -3.50 | 84 | 12.5 | 317.2 | 82 | 12.6 | 326.5 | 78 | 12.4 | 330.8 | 75 | 12.7 | 336.2 | 70 | 12.7 | 339.0 |
| -3.75 | 66 | 10.6 | 311.9 | 66 | 10.6 | 321.8 | 62 | 10.4 | 325.5 | 60 | 10.6 | 331.0 | 57 | 10.7 | 333.7 |
| -4.00 | 50 | 8.5 | 305.5 | 49 | 8.5 | 315.5 | 47 | 8.3 | 319.6 | 46 | 8.5 | 324.7 | 44 | 8.6 | 327.7 |

Fig. 2

Implementation of
Constant Phase Gain Control Circuit

| $V_{GC}$ | φ | $P_{OUT}$ |
|---|---|---|
| 0.6 | 297.8 | 31.5 |
| 0.0 | 298.9 | 30.7 |
| -0.5 | 298.0 | 29.5 |
| -1.0 | 296.4 | 27.8 |
| -1.5 | 295.3 | 25.7 |
| -2.0 | 294.6 | 23.4 |
| -2.5 | 294.0 | 20.6 |
| -3.0 | 292.0 | 17.4 |
| -3.4 | 289.4 | 14.5 |

*$V_{OFFSET}$ = -1.8 Volts

*Fig. 3*

CONSTANT PHASE GAIN CONTROL CIRCUIT

BACKGROUND OF THE INVENTION

1. Field of the Invention

This invention relates to a constant phase gain control circuit for use in conjunction with a dual gate field effect transistor (FET) in constant phase variable power amplifier applications.

2. Brief Description of the Prior Art

Phased array radar systems are being increasingly utilized in the military electronics industry. Many such systems are presently under development as evidenced by the articles "A Dual-Gate FET Constant Phase Variable Power Amplifier," of D. M. Drury, D. C. Zimmerman and D. E. Zimmerman, 1985 IEEE MTT-S International Microwave Symposium Digest, "Class-B Operation of Microwave FETs for Array Module Applications,", of M. Cohn, J. E. Degenford and R. G. Freitag, 1982 IEEE MTT-S International Microwave Symposium Digest and "High Efficiency Single-ended and Push-pull Class-B FET Power Amplifiers," of R. G. Freitag, J. E. Degenford and M. Cohn, 1985 Government Microcircuit Applications Conference. These systems require extremely small module packages. These systems require the extensive use of microwave monolithic integrated circuits (MMICs) as the active elements in the module. A particular element in these systems which has been the topic of much research is the constant phase variable power amplifier (VPA).

The approach taken in the above referenced class-B articles is the use of single gate FETs configured for class-B operation. The authors in the above noted Cohn et al. article have reported phase variations less than six degrees from a 15 db driver level control range. This approach appears to have merit except that it does not address the entire problem involved. No consideration is given for electronically controlling the drive level. This must be provided in order to achieve a taper in the array once the modules are integrated into a system.

Another approach which is presently under development in airborne phased array power amplifiers is the use of dual gate devices to implement power programmability. One inherent need in such applications is the ability to provide power programmability with a low phase error or phase change over the programmable region. One approach is a monolithic variable power amplifier (VPA) which uses dual gate FETs. The dual gate FETs are configured with an rf termination on the second gate of the dual gate FET, chosen for optimum phase performance on the second gate of the FET. Dual gate FETs configured in this way have been modelled as two single gate FETs connected in cascode. See, for example, the above noted Drury et al. reference as well as an article entitled "Microwave Wide-Band Model of GaAs Dual Gate MESFETs," of C. Tsironis and R. Meierer, IEEE Transactions, Microwave Theory Technology, Vol. MTT-30, pages 243 to 251. The variable power feayture is achieved by changing the bias applied to the second gate. By implementing the gain control feature in this fashion, the voltage standing wave ratio (VSWR) effect is eliminated at the input as a result of the reverse isolation of the "first FET" in the dual gate FET equivalent circuit.

There are several elements in these circuits, some nonlinear in nature, which are sensitive to process and fabrication variations. As a result of these process and fabrication variations, dual gate FET VPAs of the prior art have typically demonstrated transmission phase variations which are in excess of the system level requirements.

To date, dual gate variable power amplifiers have implemented the variable power mode by changing the bias applied to gate-2 of the dual gate FET exclusively as demonstrated in the above noted Drury et al. article. Since these devices operate in the saturated regime, there are elements in the FET equivalent circuit which are nonlinear in nature.

SUMMARY OF THE INVENTION

In accordance with the present invention, there is provided a variable power amplifier utilizing dual gate FETs wherein the variable power amplifier is controlled using a constant phase voltage, Vg1, on one of the gate electrodes, this voltage being a function of the voltage on the second gate electrode f(Vg2), wherein Vg1=f(Vg2), to provide a gain control circuit wherein the phase variations are reduced approximately three fold. Although the dependance between the FET nonlinear elements and the applied bias is not known explicitly, results of extensive phase bridge measurements have shown that the total transmission phase variation over the gain control range can be significantly reduced by forcing a dependance between the bias applied at the two gate electrodes. The optimum dependance between the bias voltages can be closely approximated by a linear relationship with a d-c level offset. A simple implementation of this linear relationship and the appropriate connection to the dual gate FET is provided by a resistive divider circuit interconnecting the two gate electrodes and at an input to one of the gate electrodes.

The following mathematical relationships can be obtained from analysis of the gain control circuit of FIG. 1:

$$Vgc = Vg2 \qquad (1)$$

$$I1 = \frac{Vg2 - Voffset}{R1 + R2} \qquad (2)$$

$$Vg1 = Vg2 - R1\,I1 \qquad (3)$$

$$Vg1 = \frac{R2}{R1 + R2} Vg2 + \frac{R1}{R1 + R2} Voffset \qquad (4)$$

As can be seen from equation (4) immediately above, almost any slope and/or offset level can be obtained by correct choice or R1, R2 and Voffset. This demonstrates the adaptability of this gain control circuit. Each resistor R1 and R2 can be segmented in a monolithic implementation such that several different slopes and/or offsets can be achieved by selective wire bonding of the segmented resistor on the chip after processing.

In a demonstration of this technique, the value of Vg1 was varied less than twenty percent, resulting in essentially no change of the device input impedance. Therefore, this control circuit will not cause appreciable variation of the input VSWR which could result in phase errors.

The constant phase Vg1=f(Vg2) gain control circuit significantly simplifies the task of realizing constant phase variable power amplifiers which meet the system level phase variation requirements.

The power amplifier circuit comprises a dual gate FET of the type used in the prior art wherein a d-c bias is applied to gate electrode G1 of the FET with a variable voltage being placed on gate electrode G2 thereof to implement the gain control. Power programmability is altered by making one of the potentials a function of the other. An offset voltage is applied at one node which is effectively similar to the gate G1 node of the prior art and the gain control voltage Vgc which is variable, as in the prior art, is applied to the other node. The two voltages at gates G1 and G2 are made functions of each other by coupling the gates G1 and G2 of the dual gate transistor with a resistor R1 of the FIGURE and placing a resistor R2 of the FIGURE in the offset voltage line. The values of the resistors determine slope as noted hereinabove. The result, as experimentally measured in the laboratory, has been a three fold decrease in phase excursion of the circuit. The characteristic is non-linear. An explanation for the above described circuit behavior has not been provided to date.

BRIEF DESCRIPTION OF THE DRAWING

FIG. 2 illustrates a chart providing different power output and phase differences for various input conditions for the circuit of FIG. 1.

FIG. 3 illustrates a chart providing the implementation of the constant phase control circuit of FIG. 1 with Voffset held constant and Vgc varied.

DESCRIPTION OF THE PREFERRED EMBODIMENT

Figure 1:
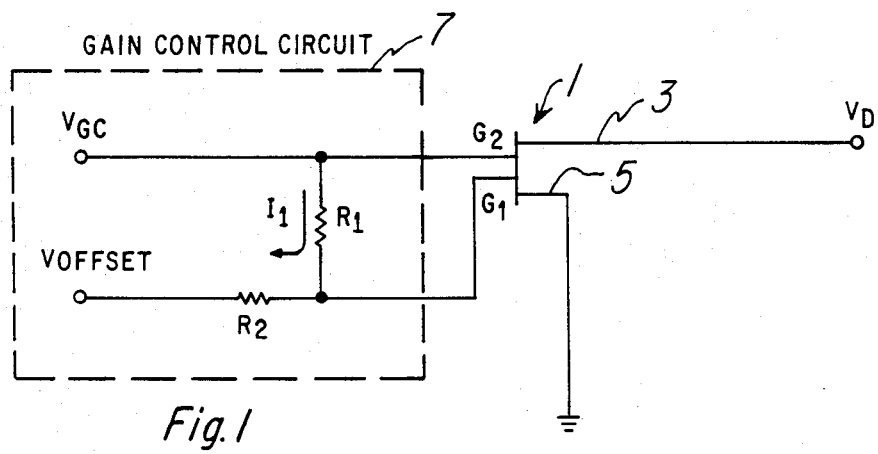
FIG. 1 is a circuit diagram of a constant phase gain control circuit connected to a dual gate FET in accordance with the present invention.

Referring now FIG. 1, there is shown a prior art dual gate FET 1 having a drain electrode 3 coupled to a circuit output Vd. The other source electrode 5 thereof is coupled to reference voltage or ground. The FET also includes a first gate electrode G1 and a second gate electrode G2. A gain control circuit 7 is connected to the gate electrodes of the FET 1, the gain control circuit including a Voffset input, which is a constant d-c input voltage, coupled through a resistor R2 to the gate electrode G1, a Vgc input coupled to the gate electrode G2 and a resistor R1 coupled between the gate electrode G2 and the gate electrode G1. The values of the resistors are determined empirically as will be explained hereinbelow.

First, considering the circuit of FIG. 1 with resistors R1 and R2 removed, an analysis was made wherein, for a first fixed voltage on gate electrode G1, the voltage of gate electrode G2 was varied and the power at the output Vd and relative transmission phase were determined for each different voltage on gate electrode G2. This procedure was repeated with incrementally different voltages on gate electrode G1 and a chart of the different power output and phase differences was made. A typical such chart is set forth herein as FIG. 2. A review of the chart indicates that approximately the same phase difference was obtained for different combinations of voltage on gate electrodes G1 and G2 as evidenced by, for example, the dashed line shown in the Appendix which passes through designations of measured phase which are approximately the same. It was also noted that the data points on the chart which displayed approximately the same phase difference fell along a line with a measurable slope as is evidenced by the dashed line in FIG. 2. In view thereof, it became apparent that the phase difference was a function of both the voltage at Vg1 and the voltage at Vg2. Accordingly, in order to translate this finding into the circuit itself, the resistors R1 and R2 were added to the circuit whereby Vg1 is a function of Vg2 and the resistance values of resistors R1 and R2 determine the slope of the operating line in the chart of FIG. 1 as determined by the equations set forth hereinabove.

In a typical example, using the circuit of FIG. 1 wherein the dual gate FET transistor is an 1800 micron and R1 is 1300 ohms and R2 is 280 ohms, with voltages on the Vgc and Voffset inputs as set forth in FIG. 2, a chart was prepared as set forth in FIG. 3. It can be seen from a review of the chart in FIG. 3 that, with Voffset held constant and Vgc varied, there is a substantial reduction in the excursion of the phase difference relative to that of the circuit of FIG. 1 without the gain control of the present invention. It is therefore readily apparent that the gate control circuit of the present invention provides an output from the dual gate FET which displays a substantial reduction in phase excursion relative to the FET without the gain control circuit.

Though the invention has been described with respect to a specific preferred embodiment thereof, many variations and modifications will immediately become apparent to those skilled in the art. It is therefore the intention that the appended claims be interpreted as broadly as possible in view of the prior art to include all such variations and modifications.

I claim:

1. A method for isolating phase control from gain control in a radar system, the system including a gain control circuit with a FET, the FET having first and second gate electrodes and a pair of source and drain electrodes, the first gate electrode coupled for receiving an RF input signal and one of the source and drain electrodes providing an output signal, the method including the steps of:
   coupling the first gate electrode to an offset DC voltage level; and
   providing a gain control bias voltage level to the second gate electrode the total bias voltage level at the first gate electrode being a function of said gain control voltage level to reduce phase variations between the input and output signals as the FET gain is changed.

2. The method of claim 1 wherein the gain control voltage and the offset voltage are coupled to the first gate electrode with a resistor network.

3. The method of claim 1 wherein the resistor network is structured to provide a linear relation between the bias voltage levels provided to the first and second gate electrodes.

4. The method of claim 1 wherein the resistor network comprises a first resistor coupled in series between the offset voltage and the first gate electrode and a second resistor connected between the first and second gate electrodes.

* * * * *